(12) United States Patent
Chang et al.

(10) Patent No.: US 6,763,513 B1
(45) Date of Patent: Jul. 13, 2004

(54) CLOCK TREE SYNTHESIZER FOR BALANCING RECONVERGENT AND CROSSOVER CLOCK TREES

(75) Inventors: Jui-Ming Chang, San Jose, CA (US); Chin-Chi Teng, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 43 days.

(21) Appl. No.: 10/183,331

(22) Filed: Jun. 26, 2002

Related U.S. Application Data
(60) Provisional application No. 60/342,007, filed on Dec. 18, 2001.

(51) Int. Cl.[7] .............................................. G06F 17/50
(52) U.S. Cl. ................... 716/14; 716/2; 716/6; 716/11; 716/18
(58) Field of Search ........................ 716/2, 6, 11, 14, 716/18

(56) References Cited

U.S. PATENT DOCUMENTS 6,324,679 B1 * 11/2001 Raghunathan et al. ........ 716/18
6,550,045 B1 * 4/2003 Lu et al. ...................... 716/6

* cited by examiner

*Primary Examiner*—Vuthe Siek
*Assistant Examiner*—Thuan Do
(74) *Attorney, Agent, or Firm*—Daniel J. Bedell; Smith-Hill and Bedell (57) ABSTRACT

A clock tree synthesizer alters a clock tree design to balance a clock tree receiving and distributing one or more clock signals to many clocked devices ("sinks") within an integrated circuit, wherein the clock tree includes one or more crossover and reconvergence points at outputs of multiplexers receiving clock signals via different paths through the clock tree. The clock tree synthesizer balances the clock tree by first balancing the subtree downstream of each multiplexer and then representing the multiplexer and the subtree with a separate macro for each multiplexer input, each macro representing the path delay from the corresponding multiplexer input to the sinks receiving clock signal inputs via the subtree. When the clock tree includes crossover points, the macros split the clock tree into a separate tree for each clock signal. The clock tree synthesizer then balances each resulting separate tree, and thereafter replaces the macros with the multiplexers and balanced subtrees they represent, thereby producing a single balanced clock tree for all of the distributed clock signals.

22 Claims, 6 Drawing Sheets

FIG. 1

(PRIOR ART)

CLOCK TREE SYNTHESIZER FOR BALANCING RECONVERGENT AND CROSSOVER CLOCK TREES

CROSS-REFERENCE TO RELATED APPLICATIONS

The present application claims benefit of U.S. Provisional Application No. 60/342,007, filed Dec. 18, 2001.

BACKGROUND OF THE INVENTION

1. Field of the Invention

The present invention relates in general to computer-aided design (CAD) tools for generating integrated circuit (IC) layouts, and in particular to a clock tree synthesizer for balancing reconvergent and crossover clock trees for IC layouts.

2. Description of Related Art

Figure 1:
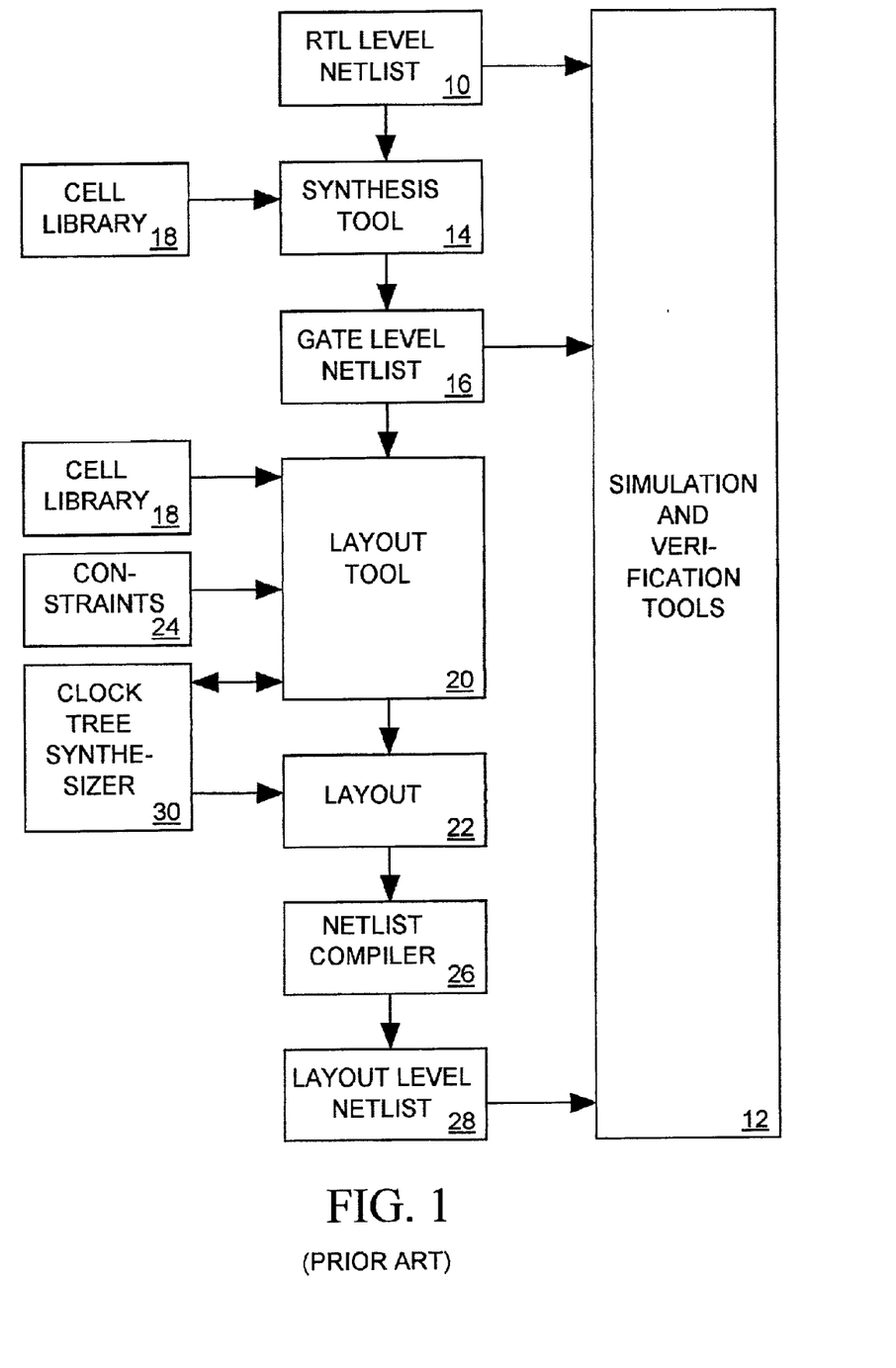
FIG. 1 is a data flow diagram illustrating a typical prior art integrated circuit design process.

FIG. 1 is a data flow diagram illustrating a prior art integrated circuit design process. An IC designer initially generates a register transfer language (RTL) netlist 10 describing an IC as a set logic blocks linked though signal paths ("nets"). An RTL netlist 10 often describes the logic blocks somewhat abstractly, using mathematical statements to define the boolean logic they are to carry out. After employing tools 12 to simulate and verify the behavior of the circuit described by RTL level netlist 10, the designer uses a synthesis tool 14 to convert the RTL level netlist 10 into a "gate level" netlist 16 describing the logic blocks more concretely by referencing the particular circuit devices (cells) that are to interconnect their terminals. A cell library 18 describes each kind of cell gate level netlist 16 may incorporate into the IC, and the gate level netlist does so by referencing their descriptions in cell library 18.

After employing tools 12 to simulate and verify behavior of the circuit described by gate level netlist 16, the designer uses a layout tool 20 to generate a layout 22 for the IC design described by gate level netlist 16. Layout 22 is a data file describing how and where each cell is to be formed in a semiconductor substrate and indicating how the various signal paths ("nets") interconnecting them are to be formed and routed. Layout tool 20 consults cell library 18 to determine the size, shape and internal layout of each cell. As it designs the nets interconnecting cell terminals, layout tool 20 tries to satisfy various constraints 24 the designer places on cell placement and path routing.

After layout tool 20 generates IC layout 22, a netlist compiler 26 processes layout 22 to produce another "layout level" netlist 28 modeling the circuit as a set of library cells interconnected by the nets designed by layout tool 20. Inclusion of behavioral models of the nets renders layout level netlist 28 a more accurate model of the behavior of the IC than RTL and gate level netlists 10 and 16 because the nets affect the speed and other characteristics of the signals passing between cells. The designer may again employ simulation and verification tools 12 to determine whether layout level netlist 28 describes an IC that will behave as expected. The layout process is typically iterative in that layout tool 20 iteratively modifies layout 22 until it arrives at a layout satisfying all constraints 24.

As a part of the process of generating layout 22 for an IC employing synchronous logic, layout tool 20 employs a clock tree synthesizer (CTS) 30 to develop a clock tree for the IC. A "clock tree" is a network of buffers for delivering one or more clock signals to various cells of the IC such as registers, latches, flip-flops and the like (herein below referred to as "sinks") that time their operations in response to edges of a clock signal.

Figure 2:
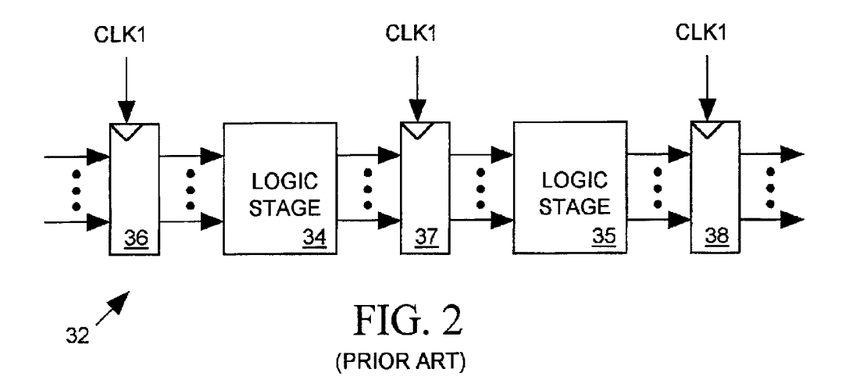
FIG. 2 is a block diagram illustrating a portion of a typical prior art synchronous logic circuit.

FIG. 2 illustrates a portion of a typical synchronous logic circuit 32 including logic stages 34 and 35 having input and output signals linked through a set of sinks 36–38 clocked by a clock signal CLK1. Since the gates forming logic stages 34 and 35 are unclocked, the signal path delays through logic stages 34 and 35 can vary with the nature the gates forming their internal logic and with IC temperature and process variations. Although the signal path delays through logic stages 34 and 35 can be somewhat unpredictable, sinks 36–38 allow state changes in the input signals to logic stages 34 and 35 to occur only on edges of clock signal CLK1, and those state changes are highly predictable when the clock signal is derived from a stable source. Thus registers 36–38 render the timing of state changes in signals passing from stage-to-stage highly predictable even though the path delays through the stages themselves cannot be predicted with high accuracy.

Figures 3, 4:
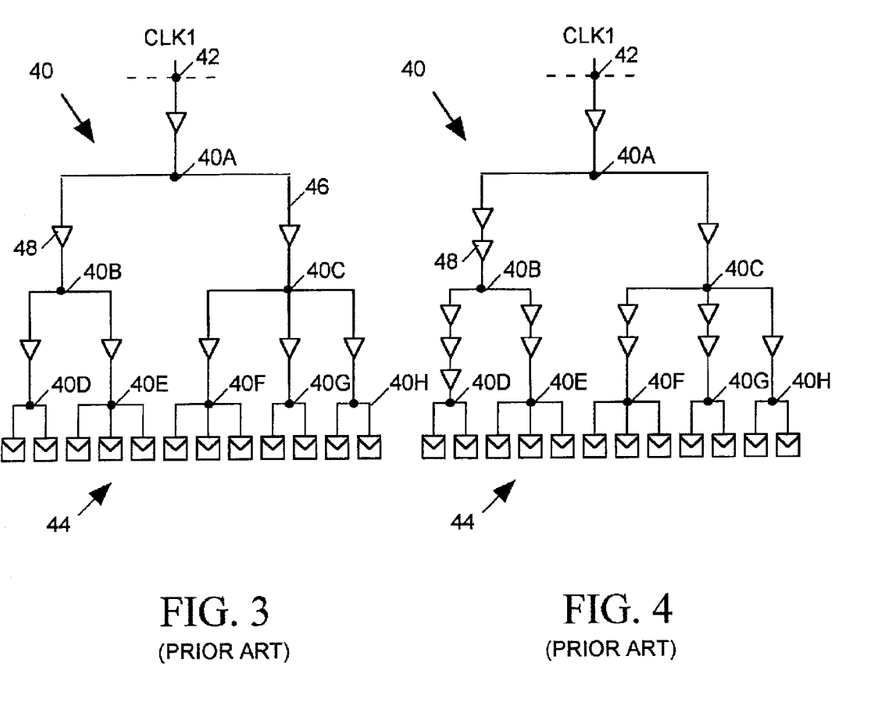
FIG. 3 is a schematic diagram depicting an unbalanced clock tree as might be produced by the prior art clock tree synthesizer of FIG. 1.
FIG. 4 is a schematic diagram depicting a balanced version of the clock tree of FIG. 3 as might be produced by the prior art clock tree synthesizer of FIG. 1.

FIG. 3 is a schematic diagram illustrating a simple clock tree 40, as might be designed by CTS 30 of FIG. 1, for delivering a clock signal CLK1 entering an IC at an entry point 42 to a set of twelve sinks 44. (In practice a clock tree may ICs deliver clock signals to thousands of sinks.) Clock tree 40 includes a set of branching signal paths 46 with buffers 48 inserted into various branches to prevent clock signal CLK1 from attenuating too much as the tree fans the CLK1 signal out to sinks 44.

Since sinks 44 are distributed about the semiconductor substrate space occupied by the IC, signal distances and path delays from entry point 42 to sinks 44 can vary significantly. Therefore, as illustrated in FIG. 4, when it is necessary to ensure that clock signal edges arrive at all sinks 44 at the same time with a high degree of accuracy, CTS 30 of FIG. 1 "balances" clock tree 40 by inserting additional buffers 48 in selected branches of the tree.

The delay between arrival of an edge of the CLK1 signal at entry node 42 and subsequent arrival of that edge at any one of sinks 44 is primarily a function of the capacitance of the various branches of tree 40 the CLK1 signal traverses as it travels from entry node 42 to each sink 44. The capacitance of a branch is in turn a function of path distance, its proximity to nearby conductors and the dielectric constants of insulating materials therebetween. As the capacitance of the path the CLK1 signal follows to any sink 44 increases, the rise and fall times of CLK1 signal edges decrease, thereby increasing the delay with which state changes in the CLK1 signal appear at the clock inputs of the sync. When CTS 30 alters the clock tree design to insert a buffer 48 into a branch of clock tree 40, the buffer provides additional current to charge or discharge the capacitance of the segment of the branch it drives, thereby increasing rise and fall times of clock signal edges and decreasing the overall CLK1 signal path delay to the sinks downstream of the buffer. The number and positions of buffers 48 inserted into a given branch of a clock tree, as well as size (power) and switching speed characteristics of the buffers, affect the amount by which they speed up a clock signal passing though that branch.

To balance a clock tree 40 that it has established, clock CTS 30 of FIG. 1 first determines path delays within the clock tree in part by analyzing IC layout to determine path signal lengths and capacitances. Clock tree CTS 30 then adds one or more buffers 48 to various branches of the tree as needed to ensure that clock tree 40 delivers the CLK1 signal to all sinks 44 with a timing variation ("skew") that is within a specified limit. In doing so, CTS 30 may adjust the position of each buffer 48 within the branch, as well as the size or switching speed characteristics of the buffer, to finely adjust the amount by which the buffer will speed up the CLK1 signal.

For example to balance tree 40, CTS 30 estimates the path delay from node 40A to nodes 40B and 40C of FIG. 3 and then, as illustrated in FIG. 4, adds one or more buffers 48 to the slower of the two paths sized and positioned to ensure that the CLK1 signal will arrive concurrently at nodes 40B and 40C. CTS 30 compares the estimated path delays in the branches extending from nodes 40A and 40B to nodes 40D–40H, determines which the branch (40C to 40H), has the shortest delay, and then adds buffers 48 to all other branches to set their delays as close as possible to that short delay. A similar balancing algorithm can be used to balance very large clock trees.

Initially CTS 30 only roughly specifies the routing of the various branches 46 of clock tree 40, only roughly estimates the delay within each clock tree branch, and only roughly specifies the position of each buffer 48 within the IC layout needed to balance the tree. After layout tool 20 modifies layout 22 to fix the actual position of each buffer 48 and to detail the routing of branches of the clock tree extending to each buffer and sync, CTS 30 may review the layout to more accurately estimate signal path delays based on the actual route of each branch and position of each buffer in the layout, and may direct layout tool 20 to resize or reposition various buffers 48 as necessary to appropriately limit clock signal skew. Several such layout/synthesis iterations may be needed before the system converges on a well-balanced clock tree design.

Multiple Clock Tree Synthesis

Figure 5:
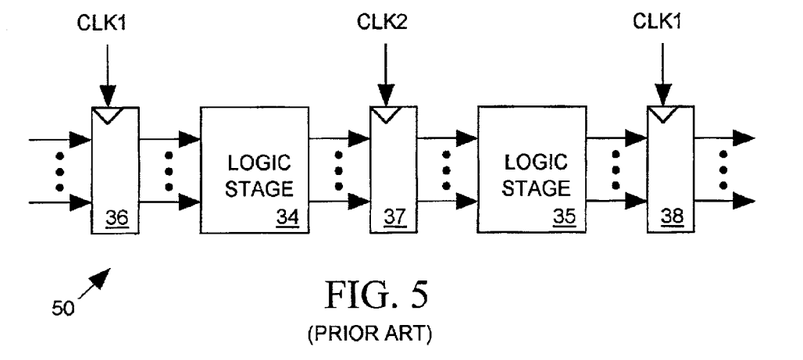
FIG. 5 is a block diagram illustrating a portion of a typical prior art synchronous logic circuit having two separate clock inputs.
Figure 6:
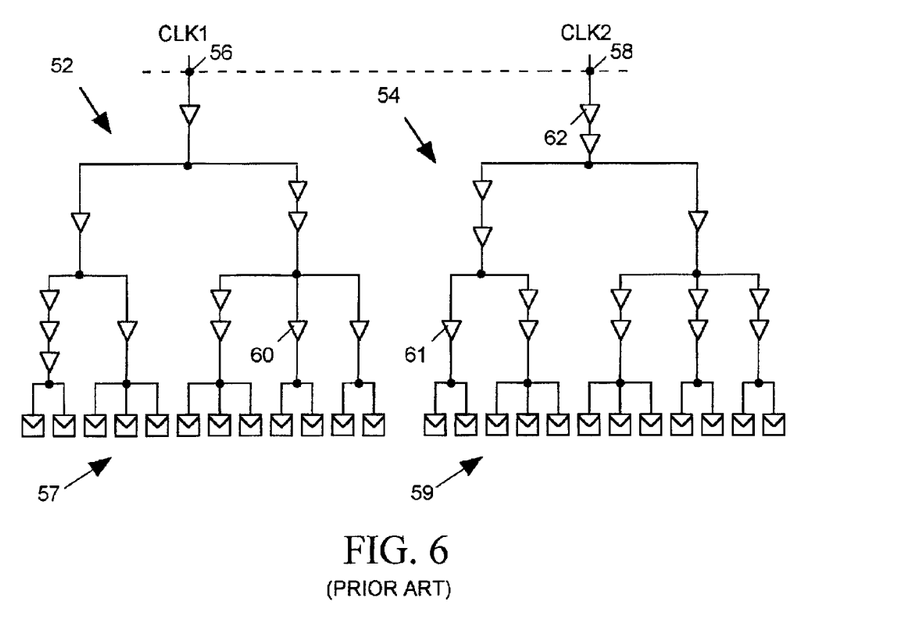
FIG. 6 is a schematic diagram depicting a pair of balanced clock trees for distributing two separate clock signals within an IC as might be produced by the prior art clock tree synthesizer of FIG. 1.

Many ICs require more than one clock signal. FIG. 5 illustrates an example circuit 50 that is similar to circuit 32 of FIG. 2 except that sink 37 is clocked by a clock signal CLK2 differing from clock signal CLK1 that clocks sinks 36 and 38, for example by having a different phase. In such case CTS 30 cam synthesize two separate clock trees, one for each clock signal. For example, as illustrated in FIG. 6, CTS 30 of FIG. 1 might synthesize a clock tree 52 for delivering clock signal CLK1 from an IC entry node 56 to a set of sinks 57 and a clock tree clock tree 54 for delivering a clock signal CLK2 from an IC entry node 58 to another set of sinks 59. CTS 30 balances clock tree 52 by adding buffers 60 to minimize the CLK1 skew at sinks 57 and separately balances clock tree 54 by adding buffers 61 to minimize the CLK2 skew at sinks 59. CTS 30 then adds buffers 62 in the root branch of tree 54 to adjust the timing of CLK2 edges at sinks 59 so that they have a desired phase relationship to edges of CLK1 signals arriving at sinks 57.

Cross-over Clock Trees

Figures 7, 8:
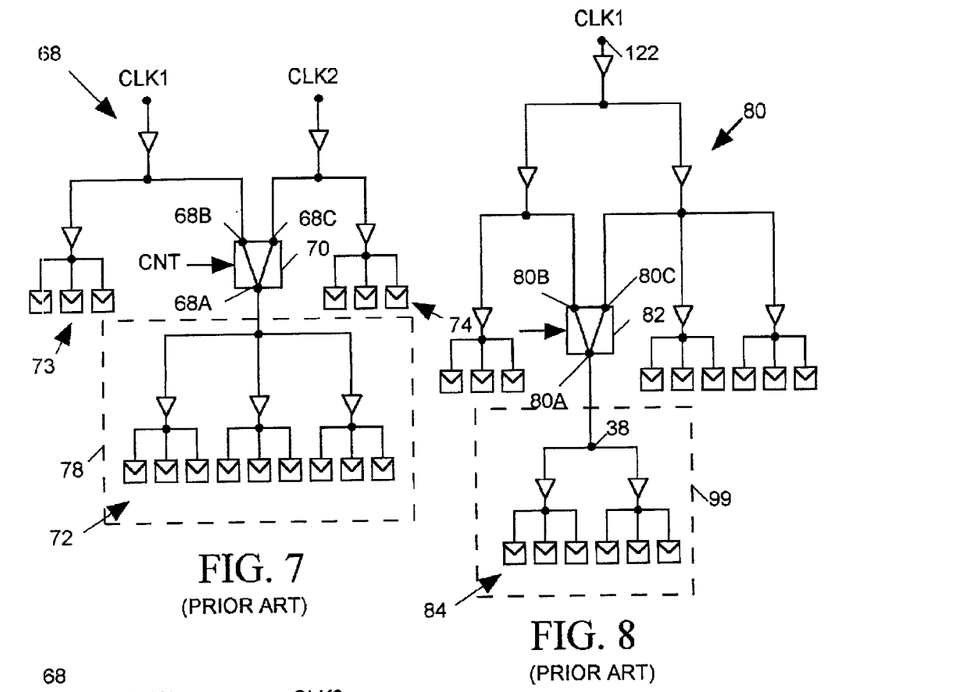
FIG. 7 is a schematic diagram depicting an unbalanced crossover clock tree as might be produced by the prior art clock tree synthesizer of FIG. 1.
FIG. 8 is a schematic diagram depicting an unbalanced reconvergent clock tree for as might be produced by the prior art clock tree synthesizer of FIG. 1.

A conventional CTS is not capable of balancing a crossover clock tree as illustrated, for example in FIG. 7. Here a multiplexer 70 allows a control signal (CNT) to determine whether a particular set of sinks 72 are to be clocked by a clock signal CLK1 or by another clock signal CLK2.

As described above, the conventional approach to balancing clock trees driven by separate clock signals is to separately balance each clock tree and then adjusts delay at the root of one of the clock trees as necessary to attain the proper phase relationship between the two clock signals. This approach does not work for a crossover clock tree because the clock signals do not drive fully independent clock trees. For example, suppose CTS 30 first balances the tree for the CLK1 signal assuming that multiplexer 70 delivers the CLK1 signal to gates 72. Then when CTS 30 thereafter tries to balance the clock tree for the CLK2 signal with multiplexer 70 switched to deliver the CLK2 signal to gates 72, it may insert buffers into branches of the subtree 78 downstream of multiplexer 70. However in doing so, it would unbalance the clock tree from the point of view of the CLK1 signal.

Reconvergent Clock Trees

FIG. 8 illustrates a "reconvergent" clock tree 80 including a multiplexer 82 that can route a clock signal CLK1 to a set of sinks 84 via either of two paths. In this case the conventional clock tree balancing approach is problematic because when the tree is balanced, for example, with switch 82 selecting its input 82A, the clock tree can become unbalanced when multiplexer 82 switches to select its input 82B.

A designer might like to design an IC having a single clock tree employing more than one multiplexer providing several crossover and/or reconvergence points for selectively delivering one or more clock signals to various sinks within the IC. Therefore what is needed is a method a clock tree synthesizer can employ to balance a clock tree regardless of the number of crossover and reconvergence points it may have.

BRIEF SUMMARY OF THE INVENTION

The invention relates to method and apparatus for use by a clock tree synthesizer (CTS) for balancing a clock tree delivering one or more clock signals to clocked devices ("sinks") within an integrated circuit, wherein the clock tree includes one or more multiplexers, each for selectively determining either which clock of two or more clock signals is to be routed to sinks downstream of the multiplexer, or for determining the path by which a clock signal is routed to those routine to the downstream sinks.

A CTS carrying out the method in accordance with the invention, balances the clock tree by first balancing a portion ("subtree") of the clock tree downstream of each multiplexer, beginning with multiplexers at the lowest levels of the clock tree and traversing the clock tree toward the sources of the clock signals.

After it balances the clock tree downstream of each multiplexer, the CTS alters the clock tree design by replacing each multiplexer and its balanced downstream subtree with a separate macro for each multiplexer input. The macro for each multiplexer input represents an estimated path delay from that multiplexer input to the downstream sinks.

When the clock tree links several different clock signals to crossover points, the macros split the clock tree into a several separate trees, one for each clock signal. After replacing all of the multiplexers and their downstream subtrees with macros, the clock tree synthesizer separately balances the clock tree for each clock signal and thereafter replaces the macros with the multiplexers and balanced subtrees they represent, thereby producing a single balanced clock tree for all distributed clock signals.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The invention relates in general to computer-aided design (CAD) tools for generating integrated circuit (IC) layouts, including clock tree synthesizers that design clock trees for IC layouts. The present invention relates in particular to software stored on computer-readable media which when read and executed by a conventional computer causes the computer to balance a design for a clock tree having crossover and reconvergence points. Suitable computer-readable media for storing the software include, but are not limited to, compact disks, floppy disks, hard disks, and random access or read only memories. This specification describes one or more exemplary embodiments and/or applications of the invention considered by the applicant(s) to be the best modes of practicing the invention. However the claims appended to the specification define the invention, and it is not intended that the invention be limited to the exemplary embodiment(s) described below or to the manner in which the embodiments operate.

A clock tree is a branching network of conductors and buffers for distributing a clock signal to several clocked devices ("sinks") within an integrated circuit such as for example registers, latches and flip-flops. A clock tree synthesizer ("CTS") designs the clock tree in a manner that tries to keep the variation in arrival time ("skew") of clock signal edges at the various sinks within a specified limit. The invention relates to a method be employed by a CTS for balancing a clock tree having one or more crossover or reconvergence points.

A "crossover point" is a node of a clock tree, typically at the output of a multiplexer that receives two or more different clock signals at its inputs and selectively passes one of them to its output. FIG. 7 illustrates an example clock tree 68 receiving two input clock signals CLK1 and CLK2 and distributing them to several groups of sinks 72, 73 and 74. Syncs 73 receive only clock signal CLK1 and sinks 74 receive only clock signal CLK2. In one mode of operation, a multiplexer 70 passes the CLK1 signal to sinks 72 while in another mode of operation multiplexer 70 passes clock signal CLK2 to sinks 72. Clock tree 68 includes a crossover point 68A at the output of multiplexer 70. FIG. 7 is a simple example; in practice a clock tree may have many crossover points at various levels of the tree.

A "reconvergence point" is a node of a clock tree, also typically at the output of a multiplexing switch, that can receive the same clock signal via either of two paths. FIG. 8 illustrates a clock tree 80 having a single clock signal input CLK1 including a reconvergence point 80A that can receive the CLK1 via either multiplexer input 80B or multiplexer input 80C. A complex clock tree can distribute many different clock signals to the sinks within an IC and may have many reconvergence and crossover points at various levels of the clock tree.

Figure 14:
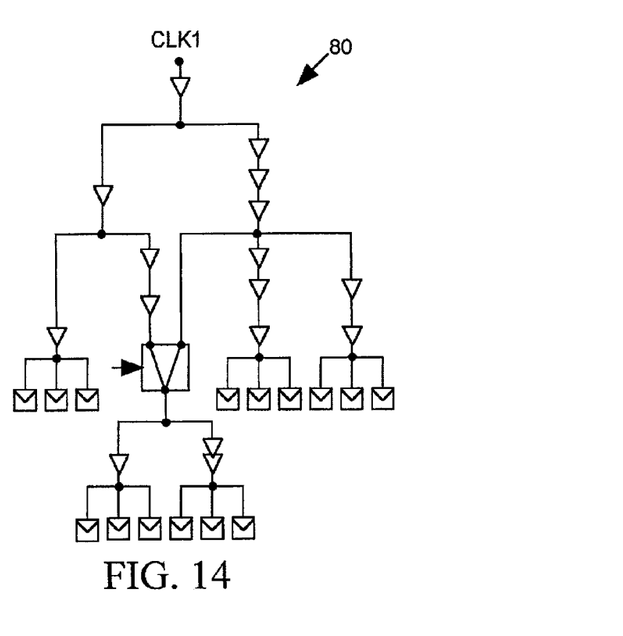

A CTS initially lays out a clock tree by organizing nearby sinks into small clusters, each of which can be driven by a signal buffer and then developing a tree of conductors for delivering the clock signal(s) from their entry nodes to the sinks via the buffers. The CTS initially employs conventional algorithms to design the clock tree to include multiplexers at reconvergence and crossover points, and to include buffers as needed to accommodate clock signal fan out. After establishing the basic structure of the clock tree including the multiplexers and a minimal set of buffers needed to fan out the clock signal, the CTS employs a method in accordance with the invention to balance the clock tree by inserting additional buffers in various branches so as to substantially equalize the signal path delay from the entry node of each clock signal to every sink it is to drive. FIGS. 7 and 8 illustrate the crossover and reconvergent clock trees 68 and 80 as they would appear immediately before the CTS begins adding buffers to balance them while FIGS. 11 and 14 respectively illustrate the same clock trees 68 and 80 after the CTS has balanced them in accordance with the invention.

Figure 9:
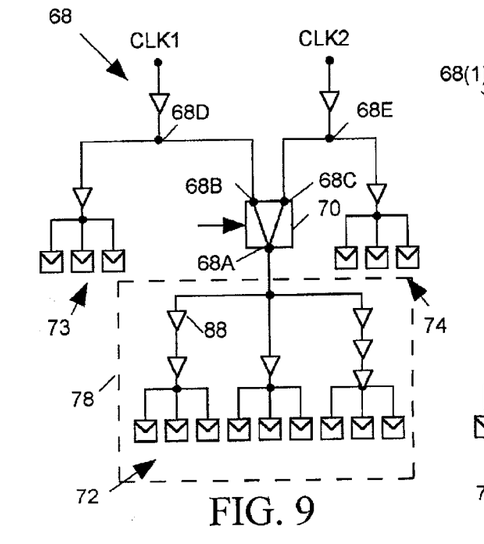
FIGS. 9–11 are schematic diagrams depicting stages in the process of balancing the crossover clock tree of FIG. 7 employing a clock tree balancing method in accordance the invention.

To balance a clock tree 68 (FIG. 7) having one or more crossover points, the CTS initially searches the tree to locate all such points, starting at the crossover points at the outputs of multiplexers residing at the lowest levels of the tree and working upwards toward the root of the tree. When it locates a crossover point, such as point 68A at the output of multiplexer 70, the CTS balances the subtree 78 including all buffers and sinks 72 downstream of the crossover point by adding buffers 88, for example as illustrated in FIG. 9, appropriately sized and positioned to substantially equalize the signal path delay from crossover point 68A to each sink 72 within subtree 78. The CTS then computes a signal path delay D1 from input 68B of multiplexer 70 to sinks 72 by adding the path delay between multiplexer input 68B and multiplexer output 68A to the delay from point 68A to sinks 72. The CTS also computes the signal path delay D2 from multiplexer input 68C to sinks 72 in a similar manner.

Note that the subtree 78 of FIG. 9 need be synthesized only once with delays D1 and D2 being computed based on the delay in the common subtree 78 and the delays from node 68B to node 68A and from node 68C to 68A, respectively.

Figure 10:
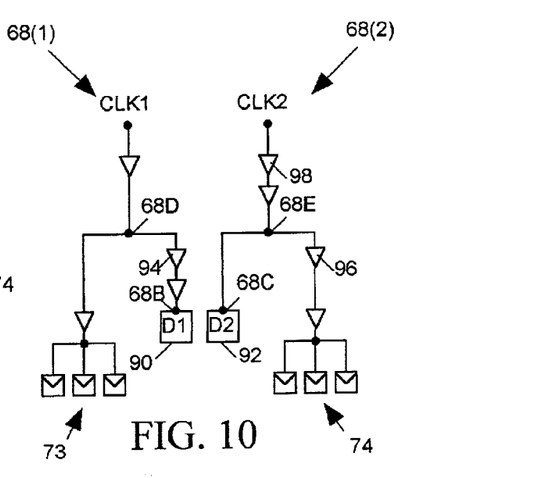

As illustrated in FIG. 10, the CTS then models multiplexer 70 and its downstream subtree 78 using two "macros"

90 and 92 positioned at nodes 68D an 68C and having delays D1 and D2, respectively. The use of macros 90 and 92 to represent multiplexer 70 and subtree 78 effectively divides clock tree 68 of FIG. 9 into two separate sections 68(1) and 68(2) as seen in FIG. 10, each corresponding to a separate one of clock signals CLK1 and CLK2. Since the example clock tree 68 of FIG. 7 includes only one crossover point 68A, the substitution of macros 90 and 92 for multiplexer 70 and subtree 78 breaks the clock tree 68 into only two separate sections 68(1) and 68(2) as illustrated in FIG. 10, one conducting only the CLK1 signal and the other conducting only the CLK2 signal. However when a similar substitution is performed at every crossover point in a clock tree having more than two clock signals, the process effectively separates the clock tree design into more than two disconnected sections, each corresponding to a separate one of clock signals distributed by the tree.

After altering the clock tree design to replace all of the multiplexers and their downstream subtrees with macros to creates two or more separate clock tree sections, the CTS then balances the separate clock tree sections independently. For example to balance the CLK1 clock tree section 68(1) of FIG. 10, the CTS inserts one or more buffers 94 sized and positioned so that the path delay from node 68D to sinks 73 matches the sum of delay D1 and the path delay from node 68D to node 68B. Similarly to balance the CLK2 clock tree section 68(2), the CTS adds buffers 96 sized and positioned so that the path delay from node 68E to sinks 74 matches the sum of delay D2 and the path delay from node 68E to node 68C. After the CTS has independently balanced both the CLK1 and CLK2 clock tree sections 68(1) and 68(2), it adds buffers 98 to the root branch of clock tree section 68(2) as necessary to achieve a desired phase relationship between clock signal edges arriving at sinks 73 and 74.

Figure 11:
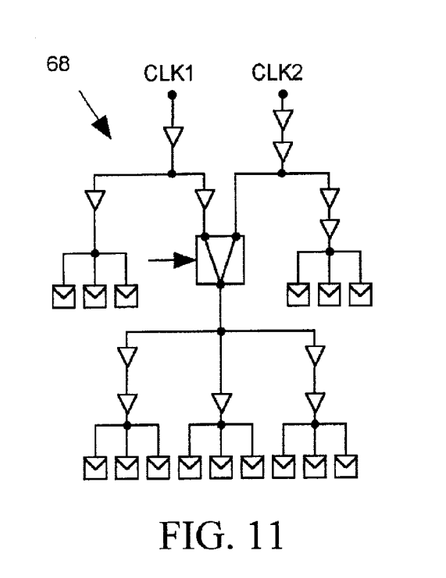

After balancing the separate clock tree sections, the CTS replaces the macros with the multiplexers and downstream subtrees they represent, thereby reconnecting the clock tree sections to form a single balanced clock tree for all clocks including the original crossover points. FIG. 11 illustrates the fully balanced version of clock tree 68 produced by replacing macros 90 and 92 of FIG. 10 with the multiplexer 70 and balanced subtree 78 of FIG. 9 the macros previously replaced.

Figure 12:
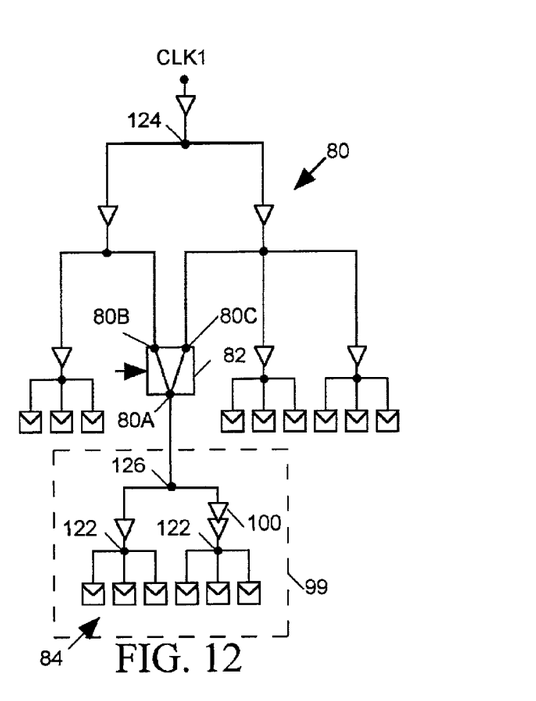
FIGS. 12–14 are schematic diagrams depicting stages in the process of balancing the reconvergent clock tree of FIG. 8 employing the clock tree balancing method in accordance the invention.

The CTS employs macros in a similar manner when balancing a clock tree having one or more reconvergence points, such as clock tree 80 of FIG. 8. The CTS initially searches clock tree 80 to locate all such reconvergence points, starting with the reconvergence points at the outputs of multiplexers residing at the lowest levels of the tree and working upwards toward the root of the tree. When it locates a crossover point, such as point BOA at the output of multiplexer 82 of FIG. 8, the CTS balances the subtree 99 including all buffers and sinks 84 downstream of the crossover point 80A by adding buffers 100, for example as illustrated in FIG. 12, appropriately sized and positioned to substantially equalize the signal path delay from reconvergence point 80A to each sink 84 within subtree 99. The CTS then computes a signal path delay D3 from input 80B of multiplexer 82 to sinks 84 by adding the path delay between multiplexer input 80B and multiplexer output 80A to the delay from output 80A to sinks 84. The CTS also computes the signal path delay D4 from multiplexer input 80C to sinks 84 in a similar manner.

Figure 13:
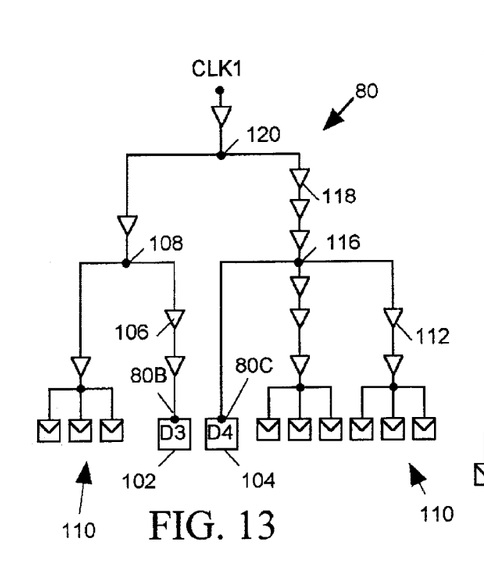

As illustrated in FIG. 13, the CTS then alters the clock tree design to represent multiplexer 82 and subtree 99 using two macros 102 and 104 positioned at nodes 80B and 80C representing delays D3 and D4, respectively. The substitution of macros 102 and 104 for the multiplexer 82 and its downstream subtree 99 eliminates reconvergence point 80A. The CTS can then balance the resulting tree adding buffers as needed to minimize the clock signal skew.

For example to balance tree 80 of FIG. 13, the CTS may insert one or more buffers 106 sized and positioned so that the path delay from node 108 to sinks 110 matches the sum of delay D3 and the path delay from node 108 to node 80B. Buffers 112 are inserted as necessary to make the delay from node 114 sinks 112 match the sum of delay D4 and the delay from node 114 to node 80C. Thereafter the CTS inserts buffers 118 as necessary to match the delay from node 120 to node 116 to the delay from node 120 to node 108. After balancing the version of the clock tree 80 of FIG, 13 including macros 102 and 104, the CTS replaces the macros with the multiplexers and balanced subtrees they represent, thereby forming the balanced clock tree illustrated in FIG. 14.

Figure 15:
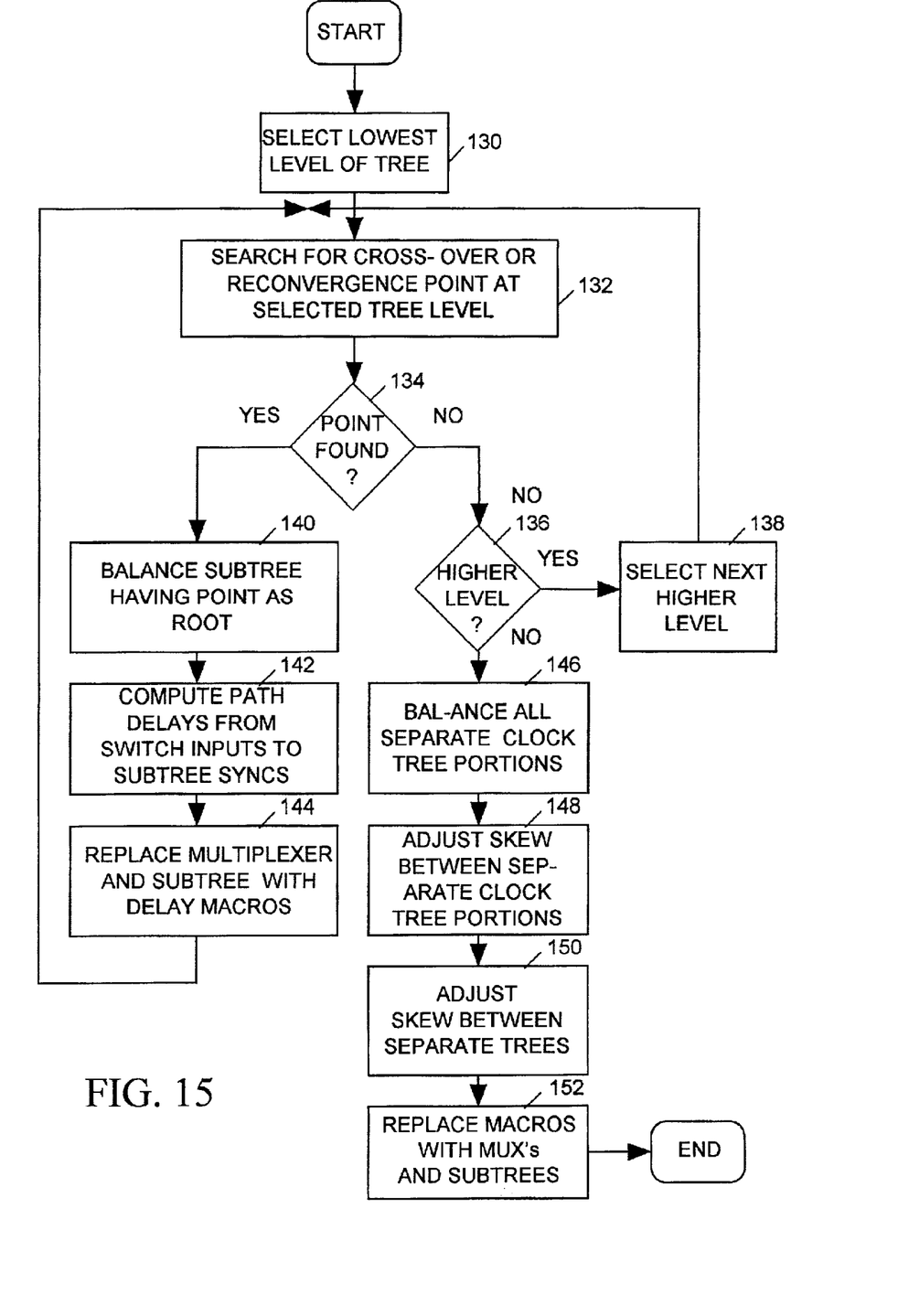
FIG. 15 is a flow chart depicting software stored on computer-readable media for programming a computer to carry out the clock tree balancing method in accordance with the invention.

FIG. 15 is a flow chart illustrating software that may be stored on computer readable media which when read and executed by a conventional computer enables the computer to act in accordance with the invention to balance a clock tree having one or more crossover and/or reconvergence points. Starting at step 130, the CTS selects the lowest level of the clock tree at which the branching nodes most distant from the entry node. For example, in the clock tree of FIG. 12 branching nodes 122 are on the lowest level of the clock tree because they are most distant (in terms of number of intervening nodes) from clock signal entry node 124. The CTS then searches for a crossover or reconvergence point at the selected clock tree level (step 132). If no crossover or reconvergence point is found (step 134) then the CTS selects a next higher level of the clock tree (step 138) and again searches for a crossover point or reconvergence point at the newly selected level (step 132). In the example tree of FIG. 12, the CTS would select the level containing node 126.

The CTS continues to search for crossover and reconvergence points at progressively higher levels of the tree until at step 134 it finds one. In the example of FIG. 12 the CTS will find a reconvergence point 80A. The CTS then balances the subtree having the reconvergence point at its root (step 140). In the example of FIG. 12, the CTS will balance subtree 99. The CTS will then compute the path delays from the inputs of the multiplexer having the convergence point at is output to the sinks of the subtree (step 142). For the example tree of FIG. 12, the CTS computes delays D3 and D4 as illustrated in FIG. 13. The CTS then replaces the multiplexer and subtree with macros having the computed delays (step 144), for example as illustrated by macros 102 and 104 of FIG. 13.

Thereafter the CTS searches for other crossover or reconvergence points at the selected tree and higher tree levels step 132), repeating steps 140, 142 and 144 for each crossover and each reconvergence point it finds until at step 136 it reaches the highest level (the root) of the clock tree. At that point the clock tree will have been split into a separately balanceable clock tree portions for each clock signal when the clock tree serves more than one clock signal and has one or more crossover points. The CTS then separately balances all of the one or more clock tree portions (step 146) and adjusts the skew between clock trees to provide the appropriate phase relationship between clock signals at sink inputs (step 148) Recall the example of FIG. 10 in which the CTS split the clock tree 68 into separate trees for the CLK1 and CLK2 signals, the CTS added buffers 98 after separately balancing the two clock trees to appropriately adjust the phase relationship between edges of the CLK1 and CLK2 signals arriving at sinks 73 and 74. The balancing process then ends after the CTS replaces all macros with the multiplexers and then balanced downstream subtrees they represent (step 152).

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method for balancing a clock tree design describing a clock tree as having a plurality of branches for distributing at least one clock signal to a plurality of sinks within an integrated circuit layout, wherein the clock tree includes at least one multiplexer, each multiplexer having a plurality of inputs for receiving the at least one clock signal via separate ones of the plurality of branches and having an output linked through a corresponding subtree of the clock tree to a subset of the sinks, the method comprising the steps of:
    a. selecting a multiplexer of the clock tree,
    b. altering the clock tree design to substantially balance the selected multiplexer's corresponding subtree; and
    c. altering the clock tree design so that it represents the selected multiplexer and its substantially balanced corresponding subtree as a set of macros, each macro corresponding to a separate input of the multiplexer and representing an estimated path delay from the corresponding multiplexer input to the subset of sinks linked to the multiplexer output.

2. The method in accordance with claim 1 wherein the clock tree design is altered at step b to describe a change in at least one of the following:
    a number of buffers included in a branch of the subtree,
    a characteristic of a buffer in a branch of the subtree, and
    a position of at least one buffer in a branch of the subtree.

3. The method in accordance with claim 1 further comprising the step of:
    d. following step c, altering the clock tree design to substantially balance the clock tree.

4. The method in accordance with claim 3 further comprising the step of
    e. following step d, altering the clock tree design to replace the set of macros with the multiplexer and substantially balanced corresponding subtree the set of macros represent.

5. The method in accordance with claim 1 further comprising the step of:
    d. sequentially selecting each other multiplexer of the clock tree and repeating steps b and c for each multiplexer selected.

6. The method in accordance with claim 5 wherein the multiplexers are selected at step d in a sequence determined in accordance with their positions within the clock tree.

7. The method in accordance with claim 5 further comprising the step of:
    e. following step d, altering the clock tree design to substantially balance the clock tree.

8. The method in accordance with claim 7 further comprising the step of:
    f. following step e, altering the clock tree design to replace each set of macros with the multiplexer and balanced corresponding subtree with the set of macros represent.

9. The method in accordance with claim 8
    wherein said at least one clock signal includes a plurality of clock signals,
    wherein following step d, the clock tree design describes the clock tree as having a plurality of sections isolated from one another, each conveying a separate one of the plurality of clock signals, and
    wherein step f merges the separate sections of the clock tree design.

10. The method in accordance with claim 1 further comprising the step of:
    d. sequentially selecting each other multiplexer of the clock tree in a sequence determined in accordance with their positions within the clock tree and repeating steps b and c for each multiplexer selected;
    e. following step d, altering the clock tree design to substantially balance the clock tree;
    f. following step e, altering the clock tree design to replace each set of macros with the multiplexer and balanced corresponding subtree with the set of macros represent.

11. The method in accordance with claim 10
    wherein said at least one clock signal includes a plurality of clock signals,
    wherein following step d, the clock tree design describes the clock tree as having a plurality of sections isolated from one another, each conveying a separate one of the plurality of clock signals, and
    wherein step f merges the separate sections of the clock tree design.

12. Computer-readable media storing software which when read and executed by a computer causes the computer to carry out a method for balancing a clock tree design describing a clock tree as having a plurality of branches for distributing at least one clock signal to a plurality of sinks within an integrated circuit layout,
    wherein the clock tree includes at least one multiplexer, each multiplexer having a plurality of inputs for receiving the at least one clock signal via separate ones of the plurality of branches and having an output linked through a corresponding subtree of the clock tree to a subset of the sinks,
    wherein the method carried out by the computer comprises the steps of:
    a. selecting a multiplexer of the clock tree,
    b. altering the clock tree design to substantially balance the selected multiplexer's corresponding subtree; and
    c. altering the clock tree design so that it represents the selected multiplexer and its substantially balanced corresponding subtree as a set of macros, each macro corresponding to a separate input of the multiplexer and representing an estimated path delay from the corresponding multiplexer input to the subset of sinks linked to the multiplexer output.

13. The computer readable media in accordance with claim 12 wherein the clock tree design is altered at step b to describe a change in at least one of the following:
    a number of buffers included in a branch of the subtree,
    a characteristic of a buffer in a branch of the subtree, and
    a position of at least one buffer in a branch of the subtree.

14. The computer readable media in accordance with claim 12 wherein the method carried out by the computer further comprises the step of:

d. following step c, altering the clock tree design to substantially balance the clock tree.

15. The computer readable media in accordance with claim 14 wherein the method carried out by the computer further comprises the step of:

e. following step d, altering the clock tree design to replace the set of macros with the multiplexer and substantially balanced corresponding subtree the set of macros represent.

16. The computer readable media in accordance with claim 12 wherein the method carried out by the computer further comprises the step of:

d. sequentially selecting each other multiplexer of the clock tree and repeating steps b and c for each multiplexer selected.

17. The computer readable media in accordance with claim 16 wherein the multiplexers are selected at step d in a sequence determined in accordance with their positions within the clock tree.

18. The computer readable media in accordance with claim 16 wherein the method carried out by the computer is further comprises the step of:

e. following step d, altering the clock tree design to substantially balance the clock tree.

19. The computer readable media in accordance with claim 18 wherein the method carried out by the computer further comprises the step of:

f. following step e, altering the clock tree design to replace each set of macros with the multiplexer and balanced corresponding subtree with the set of macros represent.

20. The computer readable media in accordance with claim 19 wherein the method carried out by the computer further comprises the step of:

wherein said at least one clock signal includes a plurality of clock signals, wherein following step d, the clock tree design describes the clock tree as having a plurality of sections isolated from one another, each conveying a separate one of the plurality of clock signals, and wherein step f merges the separate sections of the clock tree design.

21. The computer readable media in accordance with claim 12 wherein the method carried out by the computer further comprises the step of:

d. sequentially selecting each other multiplexer of the clock tree in a sequence determined in accordance with their positions within the clock tree and repeating steps b and c for each multiplexer selected;

e. following step d, altering the clock tree design to substantially balance the clock tree;

f. following step e, altering the clock tree design to replace each set of macros with the multiplexer and balanced corresponding subtree with the set of macros represent.

22. The method in accordance with claim 21 wherein said at least one clock signal includes a plurality of clock signals, wherein following step d, the clock tree design describes the clock tree as having a plurality of sections isolated from one another, each conveying a separate one of the plurality of clock signals, and wherein step f merges the separate sections of the clock tree design.

* * * * *

UNITED STATES PATENT AND TRADEMARK OFFICE
CERTIFICATE OF CORRECTION

PATENT NO.    : 6,763,513 B1
DATED         : July 13, 2004
INVENTOR(S)   : Jui-Ming Chang and Chin-Chi Teng It is certified that error appears in the above-identified patent and that said Letters Patent is hereby corrected as shown below:

Column 10,
Lines 3 and 23, "subtree with the set of macros represent" should be deleted and replaced with -- subtree the set of macros represent --.

Column 11,
Line 30, "subtree with the set of macros represent" should be deleted and replaced with -- subtree the set of macros represent --.

Column 12,
Line 20, "subtree with the set of macros represent" should be deleted and replaced with -- subtree the set of macros represent --.

Signed and Sealed this

Sixteenth Day of November, 2004

JON W. DUDAS
*Director of the United States Patent and Trademark Office*